United States Patent
Karlsson et al.

(10) Patent No.: US 6,877,221 B2
(45) Date of Patent: Apr. 12, 2005

(54) COPPER BALL INSERTION MACHINE

(75) Inventors: Birger Karlsson, Tullinge (SE);
Lars-Anders Olofsson, Järfälla (SE);
Christer Olsson, Lidingö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 193 days.

(21) Appl. No.: 10/123,290

(22) Filed: Apr. 16, 2002

(65) Prior Publication Data

US 2002/0157248 A1 Oct. 31, 2002

(30) Foreign Application Priority Data

Apr. 27, 2001 (SE) .............................................. 0101500

(51) Int. Cl.⁷ ................................................ H05K 3/00
(52) U.S. Cl. ............................ 29/845; 29/842; 29/844
(58) Field of Search .......................... 29/842, 844, 845, 29/852, 825, 853, 843, 890; 228/245, 180.22

(56) References Cited

U.S. PATENT DOCUMENTS

| | | | | |
|---|---|---|---|---|
| 5,088,639 A | * | 2/1992 | Gondotra et al. | 228/180.1 |
| 5,284,287 A | * | 2/1994 | Wilson et al. | 228/180.22 |
| 5,292,054 A | * | 3/1994 | Leeb et al. | 228/179.1 |
| 5,410,807 A | * | 5/1995 | Bross et al. | 29/843 |
| 5,465,898 A | | 11/1995 | Schulz-Harder et al. | 228/122.1 |
| 5,506,385 A | * | 4/1996 | Murakami et al. | 219/121.63 |
| 5,588,207 A | | 12/1996 | Kawakita et al. | 29/852 |
| 5,695,667 A | * | 12/1997 | Eguchi et al. | 219/388 |
| 6,595,408 B1 | * | 7/2003 | Cobbley et al. | 228/245 |
| 6,685,080 B1 | * | 2/2004 | Kee et al. | 228/103 |

FOREIGN PATENT DOCUMENTS

| | | |
|---|---|---|
| DE | 42 20 966 A1 | 1/1994 |
| DE | 195 32 992 A1 | 3/1997 |
| EP | 0 299 136 A2 | 1/1989 |
| EP | 0 843 508 A2 | 5/1998 |
| SE | 0004894-2 | 12/2000 |
| WO | PCT/SE00/01349 | 1/2001 |

* cited by examiner

Primary Examiner—Carl J. Arbes

(57) ABSTRACT

The present invention relates to a copper ball insertion machine, for integrating metal inserts in via holes provided through a printed circuit board (PCB), comprising a motor driven X-Y table (2) with the PCB on top. The X-Y table (2) is adjustable to position a selected via hole in a predetermined location aligned with a closable outlet opening (12) of a movable container (6) for metal inserts. The container is by means of a clamping cylinder (28) displaceable for clamping the part of the PCB adjacent said via hole against the working surface (2) of said X-Y table. By means of a pivoting cylinder (20) the container is rotatable for feeding one metal insert through the outlet opening (12) into said via hole. A stamp (30) is drivable by a hammer cylinder (40) for compressing said metal insert to shape and deform it into a tight fit with the via hole.

16 Claims, 5 Drawing Sheets

Figure 1:
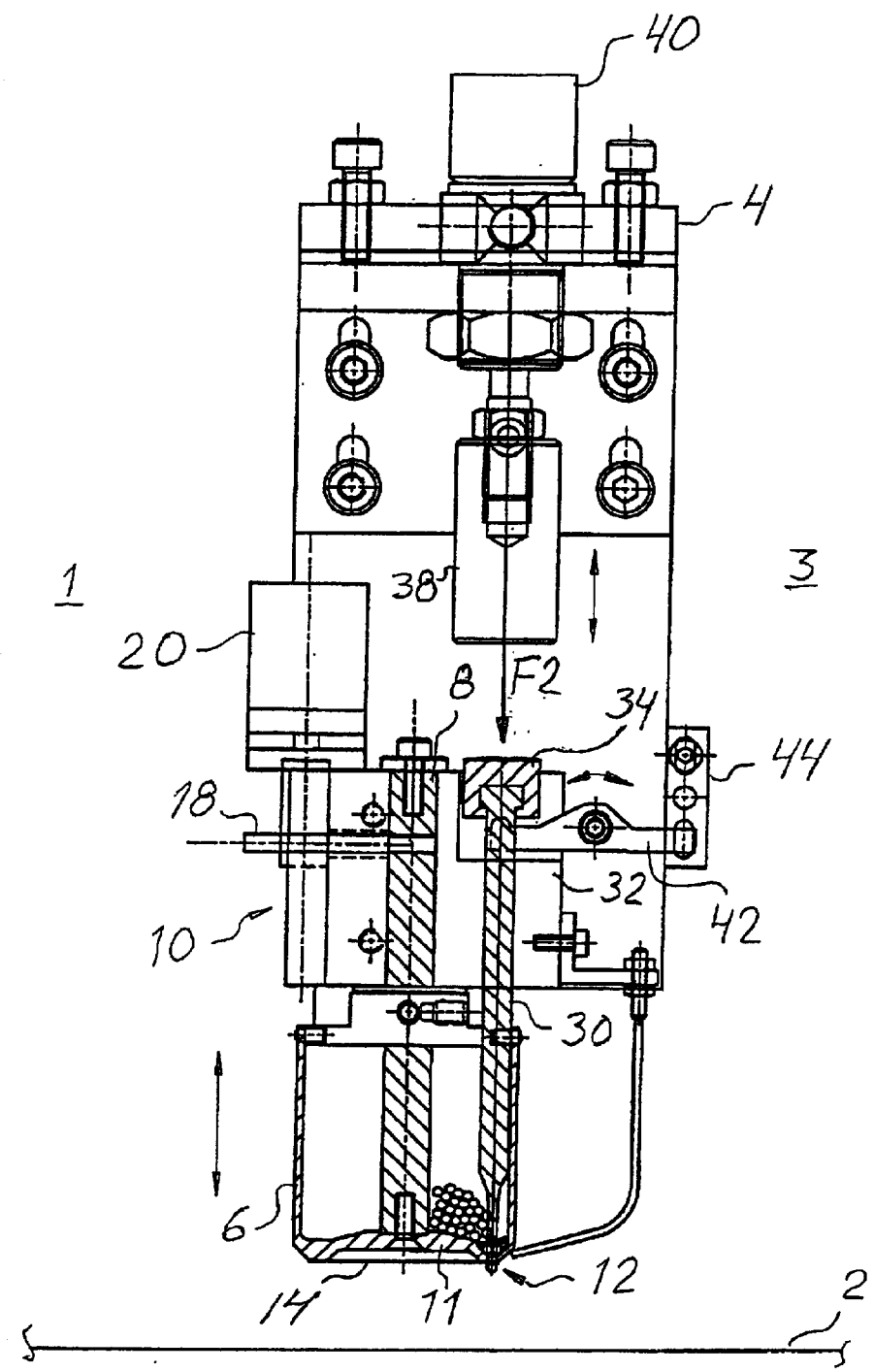

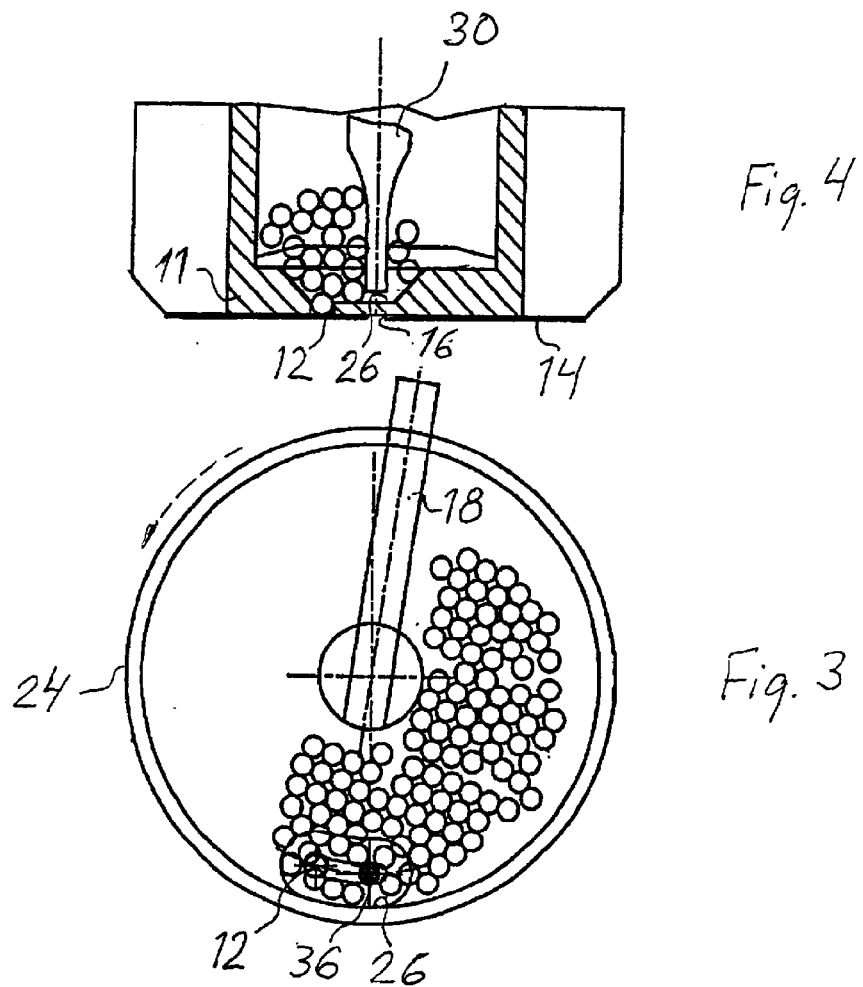
Fig. 4
Fig. 3
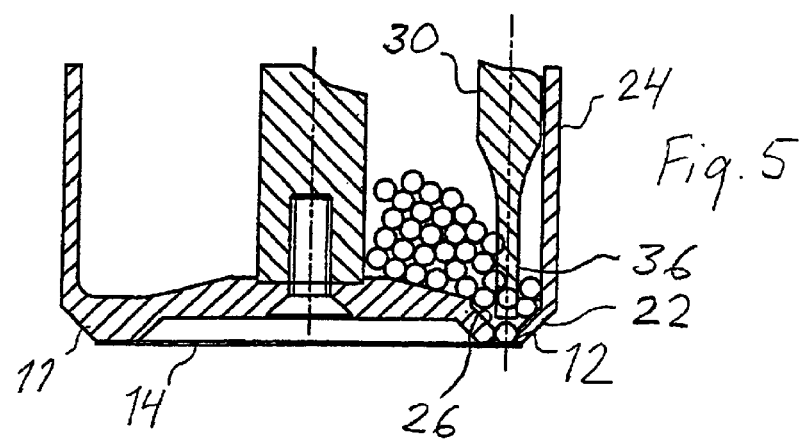
Fig. 5

a
b  Fig. 9
c
a b
c

COPPER BALL INSERTION MACHINE

FIELD OF INVENTION

The present invention relates to a means and method for making modifications of printed circuit boards to decrease the thermal and electric resistance from one side to another of a printed circuit board (PCB) by integrating metal inserts in via holes provided through said PCB.

BACKGROUND OF THE INVENTION

A crucial part of the transceiver function (TRU) in a radio base station (RBS) is the power amplifier (PA). The TRU dissipates a great quantity of heat when transforming signals from the telephone exchange to the antenna and further out to cellular phones etc. The radio frequency power transistors generate most of the heat quantity, but also other components such as radio application specific circuits (RFASIC) are generating heat. The total of the heat quantity might be difficult to transfer to the surrounding atmosphere via the cooling fins, which usually are arranged on the outside of the shielding box that that surrounds the electronics.

The use of so called thermal vias is one previously known technique to conduct heat through a printed circuit board (PCB). A via is usually a small copperplated hole or barrel in the PCB, which is positioned beneath a heat-dissipating component. Several holes might be needed to achieve a good thermal path from a component to the cooling fins. The design of a component package is often such that a heat pad is available on the bottom of the package. This heat pad is by solder material connected to the copper pad on the PCB and through the copperplated vias to the cooling fin arrangement.

One problem with this technique that might occur is that solder droplets easily appear on the bottom side of the PCB during the soldering process. This implies that it might not be possible to fasten the PCB tight with the fin arrangement, which would cause a bad thermal path. This in turn might cause damage to the components due to severe overheating and unintentional bending of the PCB. In addition, the thermal conductivity of a copperplated via is relatively low, which limits this traditional method to an effective output of approximately 10 W.

Apparently, there has been a need for making modifications of printed circuit boards to decrease the thermal resistance from one side to another of said boards and to reduce the appearance of solder droplets on the opposite side of the board relative to the component body.

Also, it has been proposed to make said modifications by integrating copper inserts in the PCB to achieve an effective output of up to ten times more compared to what can be ac+hieved by means of the traditional method. The copper inserts also effectively hinder the appearance of solder other than in the joint position.

In each of SE 0004894-2 and PCT/SE00/01349 (WO 01/01738), which have been filed with the same inventor and applicant as in the present application, is described a method of providing modified thermal vias in a printed circuit board of the above mentioned kind and a printed circuit board that includes vias arranged in accordance with the aforesaid method.

One problem involved in providing modified printed circuit boards is that, information taken, hitherto it has been quite time consuming and complicated to achieve the advantages afforded by the above patent applications in manually performed steps for each modified PCB. Therefore, it would be desirable to make said modifications automatically and preferably by a means arranged to integrate said copper inserts in the PCB as a natural process step during the PCB fabrication.

SUMMARY OF THE INVENTION

One object of the present invention is to at least reduce the aforesaid problem.

One advantage afforded by the present invention is that metal inserts are fast and easily mounted into via holes in a PCB.

Another advantage afforded by the present invention is that the PCB is clamped around the via hole during the insertion and deforming steps, which protects the board from being delaminated and destroyed.

A further advantage afforded by the present invention is that this machining process might be carried out as a natural step in a PCB-manufacturing process.

Advantageously, the degree of deformation of a metal insert is adjustable by controlling the air pressure and the activating frequency of the compression means.

Suitably, the means according to the present invention makes it is possible to insert differently sized insertions into PCB:s of varying thickness.

Preferably, the consequence of tolerances in PCB-thickness might be considerably reduced by the clamping operation.

DRAWING SUMMARY

Figure 2:
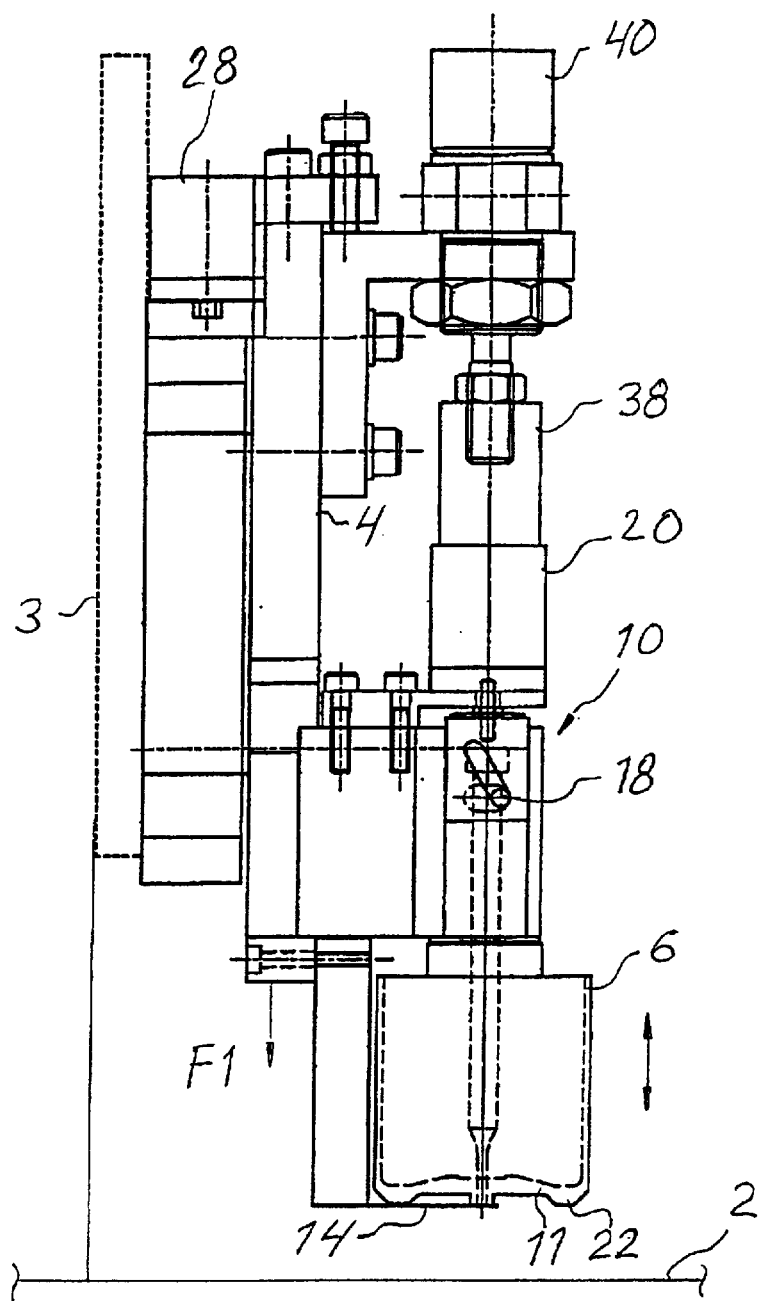
Figure 7:
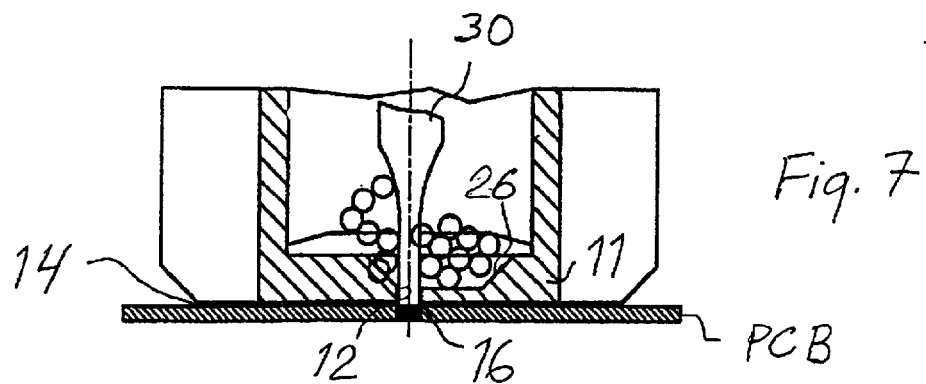
Figure 6:
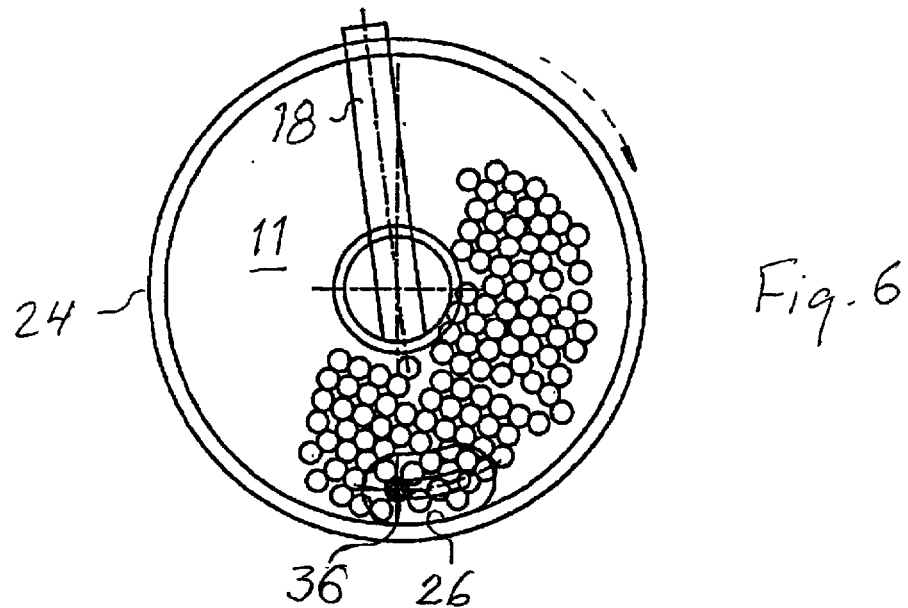
Figure 8:
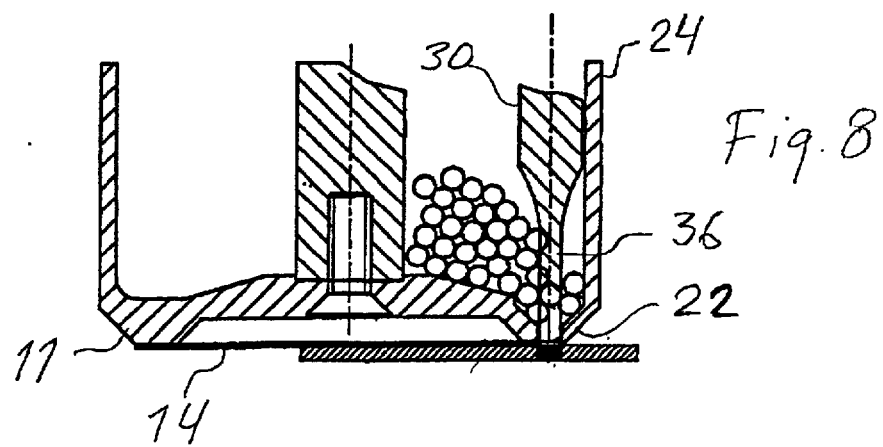
Figure 10:

FIG. 1 is a front view of the copper ball insertion machine partially in section, FIG. 2 shows the copper ball insertion machine in a side view, FIG. 3 shows from above the bottom of the movable container in a first position, FIG. 4 is a peripheral cut out of FIG. 3 in greater scale which shows one ball in the closed outlet opening, FIG. 5 is a side view in cross section of the bottom part of the container in FIG. 3, which is turned 90° counterclockwise, FIG. 6 shows from above the bottom of the movable container in a second position, FIG. 7 is a peripheral cut out of FIG. 6 in greater scale which shows one hammered ball in the open outlet opening, FIG. 8 is a side view in cross section of the bottom part of the container in FIG. 6, which is turned 90° counterclockwise, FIG. 9 shows different steps of an insertion procedure of a via hole with ball-formed metal inserts, and FIG. 10 shows different steps of an insertion procedure of a differently shaped via hole with metal inserts in the form of stretched balls.

DETAILED DESCRIPTION

A machine 1 for integrating metal inserts in via holes provided through a printed A circuit board (PCB), comprises a motor driven X-Y table 2 with the PCB on top. A base plate 3 is attached to the X-Y table at right angles to its working surface 2 and a support plate 4 is arranged to be displaceable in parallel relation to said base plate 3. For example the support plate 4 and base plate 3 might be interconnected by means of a not shown guide rail means of a common design.

A rotatable container 6 for metal inserts is attached to a spindle 8, which is suspended pivotally in a bracket block 10, which in turn is fixed on the support plate 4. In its bottom 11, said container 6 is provided with an outlet opening 12, which is closable by means of a metal plate 14. Said metal plate is fixed to the lower part of the support plate 4 to abut against said bottom 11 of said container 6 and thereby cover said outlet opening 12 when located in a first position (FIGS. 3–5). The metal plate 14 is in turn provided with an outlet hole 16, which is located in a second position. By means of a manoeuvring pin 18 connected to the spindle 8, the container 6 is pivotable under the influence of a container pivoting cylinder 20 and the spring action of a not shown spring means. Accordingly, said outlet opening 12 is displaceable between said first and second positions and is aligned with the outlet hole 16 in the second position. As the outlet opening 12 and outlet hole 16 as well are bored with diameters identical to that of the via hole, a metal insert designed for the via hole may pass through into the via hole (FIGS. 6–8).

The outlet opening 12 is arranged in an annular shoulder 22 of the external bottom of the container 6 adjacent to a cylindrical wall 24 of the same. The outlet opening is widening into a funnel-alike cavity 26 on the internal side of the bottom 11. Said cavity 26 is curved and extended over radii of 12–18° parallel to the cylindrical wall 24 and the outlet opening 12 is bored through the bottom 11 in one end of the curved cavity 26.

A compression means 27 is comprised of a clamping cylinder 28, the base plate 3, the support plate 4 and the shoulder 22 of the bottom part of the container 6. The clamping cylinder 28 is connected between the base plate 3 and the support plate 4 and depending on its current activation, the shoulder 22 of the bottom part of the container 6 is displaced into and out of contact with the PCB on top of the X-Y table. Accordingly, in its contact position with the PCB the shoulder 22 is pressed against said PCB with a predetermined clamping force (F1), which can be adjusted by varying the capacity of or air pressure fed to said clamping cylinder 28.

A stamp 30 is reciprocatingly arranged in a stamp socket 32 mounted on the support plate 4. Said stamp is formed with a head 34 and an operational end 36, which is aligned with the outlet hole 16 in the metal plate 14 and designed to deform a metal insert to fit and fasten in the via hole by means of a stamp hammer 38. A hammer cylinder 40 is fixed to the support plate 4 and connected to the stamp hammer 38, which is aligned with the stamp 30. The stamp hammer is arranged to hammer on the head 34 of the stamp with a force F2 depending on the amount of air pressure let into the hammer cylinder 40. The degree of deformation of a metal insert is adjustable by controlling the air pressure and the activating frequency of the hammer cylinder. The stamp 30 is provided with a return means pivotably mounted on the support plate 4. The return means is shaped as a lever arm 42, which at one end is arranged to be urged by a driver member 44 fixed to the base plate 3 on a return movement of the support plate 4, upon discharging the clamping cylinder 28. Said lever arm 42 is by its second, fork shaped end, arranged to simultaneously lift up the stamp 30 by gripping under its head 34. Accordingly, the stamp 30 is displaceable from its working position with the operational end 36 in the outlets 12; 16 of the bottom and metal plate to its starting position with the operational end 36 slightly above the bottom of the curved cavity 26.

The metal inserts used to fill in the via holes of the PCB is preferably symmetrical metal bodies and the container 6 operated for distribution of one metal insert at a time through the outlets. Advantageously, the symmetrical metal bodies are constituted of spherical metal balls and suitably the spherical metal balls are copper balls. Copper balls are easy to manufacture with tolerances as narrow as around +−20 μm. FIG. 9 shows different steps a–c of an insertion procedure of a via hole with a ballformed metal insert. As appear from FIG. 9a the via hole is relatively wide compared to the thickness of the PCB and in FIG. 9b is disclosed that a spherical ball fits the via hole. FIG. 9c shows that a spherical ball has been deformed by the machine according to the invention to fill out the via hole almost completely.

FIG. 10 shows different steps a–c of an insertion procedure of a differently shaped via hole with a metal insert in the form of a stretched ball. As appear from FIG. 10a this via hole is relatively narrow compared to the thickness of the PCB and in FIG. 10b is disclosed that a stretched ball fits the via hole. FIG. 10c shows that a stretched ball has been deformed by the machine according to the invention to almost completely fill out also this via hole.

OPERATION

The machine 1 works in the following way in order to insert and deform a metal insert or a copper ball. The motor driven X-Y table 2 with the PCB on top is adjusted to position a selected via hole beneath the rotatable container 6 which is filled with metal balls inside. The metal plate 14 stops the balls from falling out through the outlet opening 12 in the bottom 11 of the container during the movement of the X-Y table. The container 6 is clamped to the PCB to hold it tight by means of the pressurised air driven clamping cylinder 28. By, means of the container pivoting cylinder 20 the container 6 is then rotated a few degrees, for instance 15°, so that only one ball may fall through the outlet hole 16 in the metal plate 14 into the empty hole in the PCB. The stamp 30, pressurised air driven by the hammer cylinder 40 via the stamp hammer 38, is hammering the ball to shape and deform into the via hole in the PCB. The number of hammerings may be adjusted by altering the air pressure. The container 6 is then rotated to enter its starting position, which means the metal plate 14 stops the balls to fall out during next movement of the X-Y table, to position a new selected via hole beneath the container 6. The clamping cylinder is discharged and the X-Y table is moved to the next position.

Even if the above described means and method are directed to integrating the metal inserts into the via holes of a PCB, said metal inserts might be integrated into any other appropriately performed hole in the PCB as well

What is claimed is:

1. A method for integrating metal inserts in printed circuit board (PCB) via holes to decrease the thermal and electric resistance from one side to another of said PCB, said method comprising the steps of:

securing said PCB to a movable table;

moving said table to position a via hole in said PCB beneath an outlet of a container filled with metal inserts;

opening said outlet in said container to release one of said metal inserts into said via hole, said via hole having at least one dimension larger than said metal insert whereby a void partially exists between portions of said metal insert and the walls of said via hole;

applying a force to said metal insert whereby said metal insert is deformed to substantially fill said void and lock said metal insert in said via hole.

2. The method recited in claim 1, further comprising the step of positioning a bottom portion of the container into contact with the PCB prior to opening said outlet.

3. The method recited in claim 1, wherein said outlet is located in an annular shoulder of the external side of the bottom of the container adjacent to a cylindrical wall of the same.

4. The method recited in claim 3, wherein said outlet comprises a funnel-like cavity on the internal side of the bottom of said container.

5. The method recited in claim 1, wherein said step of applying a force to said metal insert comprises the step of extending a stamping member through said outlet of said container to deform said metal insert.

6. The method of claim 1, wherein said metal inserts comprise spherical balls.

7. The method of claim 1, wherein said metal inserts comprise copper.

8. The method of claim 1, wherein said via holes are circular.

9. An apparatus for integrating metal inserts in printed circuit board (PCB) via holes to decrease the thermal and electric resistance from one side to another of said PCB, said apparatus comprising:

means for securing said PCB to a movable table;

means for moving said table to position a via hole in said PCB beneath an outlet of a container filled with metal inserts;

means for opening said outlet in said container to release one of said metal inserts into said via hole, said via hole having at least one dimension larger than said metal insert whereby a void partially exists between portions of said metal insert and the walls of said via hole; and means for applying a force to said metal insert whereby said metal insert is deformed to substantially fill said void and lock said metal insert in said via hole.

10. The apparatus recited in claim 9, wherein said container is displaceable to position a bottom portion of the container into and out of contact with the PCB.

11. The apparatus recited in claim 9, wherein said outlet is located in an annular shoulder of the external side of the bottom of the container adjacent to a cylindrical wall of the same.

12. The apparatus recited in claim 11, wherein said outlet comprises a funnel-like cavity on the internal side of the bottom of said container.

13. The apparatus recited in claim 9, wherein said means for applying a force to said metal insert comprises a stamping member extendable through said outlet of said container to deform said metal insert.

14. The apparatus recited in claim 9, wherein said metal inserts comprise spherical balls.

15. The apparatus recited in claim 9, wherein said metal inserts comprise copper.

16. The apparatus recited in claim 9, wherein said via holes are circular.

* * * * *